United States Patent
Høyerby

(10) Patent No.: US 10,554,185 B2
(45) Date of Patent: Feb. 4, 2020

(54) CLASS D AUDIO AMPLIFIER WITH OVERLOAD PROTECTION CIRCUIT

(71) Applicant: Infineon Technologies Austria AG, Villach (AT)

(72) Inventor: Mikkel Høyerby, Copenhagen SV (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/023,922

(22) Filed: Jun. 29, 2018

(65) Prior Publication Data

US 2019/0007010 A1   Jan. 3, 2019

(30) Foreign Application Priority Data

Jul. 3, 2017   (EP) .................................... 17179296

(51) Int. Cl.
*H03F 3/217*      (2006.01)
*H03F 1/52*       (2006.01)

(52) U.S. Cl.
CPC .......... *H03F 3/2173* (2013.01); *H03F 1/523* (2013.01); *H03F 2200/03* (2013.01); *H03F 2200/351* (2013.01); *H03F 2200/426* (2013.01); *H03F 2200/78* (2013.01)

(58) Field of Classification Search
CPC ...... H03F 3/2173; H03F 3/185; H03F 3/2171; H03F 1/523; H03F 2200/351; H03F 2200/03; H03F 2200/78
USPC .............................................. 330/207 A, 251
See application file for complete search history.

(56) References Cited

U.S. PATENT DOCUMENTS

| 7,554,390 B1 * | 6/2009 | Shankar .................. H03F 3/217 330/10 |
| 7,956,681 B2 * | 6/2011 | Guilherme ............ H03F 3/2173 330/10 |
| 9,564,862 B2 * | 2/2017 | Hoyerby ................. H03F 3/217 |

(Continued)

FOREIGN PATENT DOCUMENTS

| EP | 2562932 A1 | 2/2013 |
| EP | 3179631 A1 | 6/2017 |
| WO | 2012055968 A1 | 5/2012 |

OTHER PUBLICATIONS

Berkhout, Marco, "Integrated Overcurrent Protection System for Class-D Audio Power Amplifiers", IEEE Journal of Solid-State Circuits, vol. 40, No. 11, Nov. 2005, pp. 2237-2245.

*Primary Examiner* — Khanh V Nguyen
(74) *Attorney, Agent, or Firm* — Murphy, Bilak & Homiller, PLLC

(57) ABSTRACT

A class D audio amplifier with an output stage is provided. The class D audio amplifier includes a plurality of power transistors coupled in cascade between a first DC supply voltage and a second DC supply voltage. The class D audio amplifier also includes a plurality of gate drivers having respective inputs coupled to a modulated audio signal and configured to generate respective modulated gate drive signals to the plurality of power transistors. A first overload protection circuit includes a model transistor possessing electric characteristics representative of a first power transistor of the output stage for determining a drain-source reference voltage of the model-transistor and this drain-source reference voltage may be utilized to indicate an overload event or condition of the first power transistor.

20 Claims, 6 Drawing Sheets

(56) References Cited

U.S. PATENT DOCUMENTS 10,218,312 B2* 2/2019 Cope .................... H03F 3/2173
2009/0097178 A1 4/2009 Krishnan et al.

* cited by examiner

CLASS D AUDIO AMPLIFIER WITH OVERLOAD PROTECTION CIRCUIT

BACKGROUND

Class D audio amplifiers are well-known and widely recognized to provide energy efficient audio drive of a loudspeaker load by switching a modulated audio signal e.g. pulse width modulated (PWM) or pulse density modulated (PDM), across the loudspeaker load. Class D audio amplifiers typically comprise an H-bridge driver with a pair of output terminals coupled to respective sides or terminals of the loudspeaker load to apply an oppositely phased pulse width modulated or pulse density modulated audio signals across the loudspeaker. Several modulation schemes for pulse width modulated audio signals have been utilized in prior art PWM based class D amplifiers. In so-called AD modulation, the pulse width modulated audio signal at each output terminal or node of the H-bridge is switched between, or toggles between, two different levels in opposite phase. The two different levels typically correspond to the upper and lower power supply rails, respectively, such as the positive and negative DC voltage supply rails of the output stage. In so-called BD modulation, the pulse width modulated signal across the loudspeaker load is alternatingly switched between three levels of which two may correspond to the above-mentioned upper and lower DC voltage supplies while the third level is zero. The latter is obtained by simultaneously pulling both terminals of the loudspeaker load to one of the DC voltage supply rails. In multi-level PWM modulation as described in the applicant's co-pending patent application PCT/EP2011/068873, a third supply voltage level, often a set to a mid-supply level between the positive and negative DC supply rails, is applied to output node(s) of the output driver such that for example a 3-level or 5-level pulse width modulated signal can be applied across the loudspeaker load by an appropriately configured output driver.

However, there is a continued need in the art for providing effective overload, e.g. overcurrent, protection of the power transistors of the output stage while keeping power consumption of the overload protection circuitry to a minimum. It is particularly beneficial to reduce power consumption of the overload protection circuitry of class D audio amplifiers to a minimum during quiescent operation and at small audio output levels to prolong battery lifetime of portable audio equipment, reduce heat dissipation etc. At quiescent operation and small output signal levels, the power consumption of the overload protection circuitry can represent a significant portion of the total power consumption of the class D audio amplifiers and therefore render their overall efficiency sub-optimal under these operating conditions unless protection circuitry power consumption is reduced.

SUMMARY

Embodiments described herein relate to a class D audio amplifier with an output stage which comprises a plurality of power transistors coupled in cascade between a first DC supply voltage and a second DC supply voltage. The class D audio amplifier comprises a plurality of gate drivers comprising respective inputs coupled to a modulated audio signal and configured to generate respective modulated gate drive signals to the plurality of power transistors. A first overload protection circuit comprises a model transistor possessing electric characteristics representative of a first power transistor of the output stage for determining a drain-source reference voltage of the model-transistor and this drain-source reference voltage may be utilized to indicate an overload event or condition of the first power transistor.

A first aspect relates to a class D audio amplifier comprising: an input node or terminal for receipt of an audio signal; a modulator configured for receipt of the audio signal and converting the audio signal into a modulated audio signal having a carrier or modulation frequency; an output stage comprising a plurality of power transistors coupled in cascade between a first DC supply voltage (Pvdd) and a second DC supply voltage (Pvss); a plurality of gate drivers comprising respective inputs coupled to the modulated audio signal and configured to generate respective modulated gate drive signals to the plurality of power transistors; and a first overload protection circuit comprising a model transistor possessing electric characteristics representative of a first power transistor of the output stage. The first overload protection circuit is configured to: repeatedly determining a drain-source reference voltage of the model-transistor; comparing the drain-source reference voltage with a drain-source voltage of the first power transistor; and generating an overload signal based on the comparison between the drain-source reference voltage and the drain-source voltage of the first power transistor.

The class D audio amplifier may comprise pulse width modulation (PWM), pulse density modulation (PDM) or space vector modulation (SVM) such that the respective modulated gate drive signals applied to the plurality of power transistors are modulated in corresponding manner. The class D audio amplifier may include 2-level class AD or BD pulse density modulation (PDM) or two-level or multilevel pulse width modulation (PWM) using various output stage topologies such as H-bridge topology or single-ended topology.

The DC supply voltage, i.e. the difference between the first and second DC supply voltages, of the class D audio amplifier may be lie between 5 Volt and 120 Volt. The DC supply voltage may be provided as a unipolar or bipolar DC voltage for example +40 Volt or +/−20 Volt relative to a ground reference, GND, of the amplifier.

The overload protection circuit may comprise a digital or analog controller to carry out the above-mentioned tasks and possibly other house-holding or signal processing tasks. This controller may comprise a relatively simple digital circuit based on combinational logic operating asynchronously to any clock signal of the class D audio amplifier. In such an embodiment the digital controller may operate according to a self-timed mechanism and comprise a handful of appropriately configured active and passive components and digital gates to determine the drain-source reference voltage of the model-transistor, comparing the drain-source reference voltage with the drain-source voltage of the first power transistor and generating the overload signal based on the comparison between the drain-source reference voltage and the drain-source voltage of the first power transistor. However, other embodiments of the digital controller may comprise clocked sequential logic operating synchronously to a master or other system clock signal of the class D audio amplifier. In the latter embodiment, the controller may for example comprise programmable logic circuitry or a software programmable or hard-wired Digital Signal Processor (DSP) or general purpose microprocessor.

The output stage comprises at least two cascaded power transistors such as four, six or eight cascaded power transistors. The plurality of cascaded power transistors, of the output stage, preferably comprise at least one N-channel field effect transistor such as an NMOS, LDNMOS or IGBT deposited on semiconductor substrate such as Silicon, Gallium Nitride or Silicon Carbide. In certain embodiments of the output stage all power transistors are embodied as N-type MOS transistors. In alternative embodiments at least the power transistor(s) coupled in cascade between the output node and the first, or highest, DC supply voltage (Pvdd) are P-type MOS transistor(s). Hence, eliminating the need to drive the gate terminals of the P-type MOS transistor(s) to a DC voltage above the first DC supply voltage.

The plurality of power transistors of the output stage may at least comprise a second power transistor, possessing an opposite polarity of the first power transistor, driven by a second gate driver. The class D audio amplifier may additionally comprise a second overload protection circuit configured to generate an overload signal for the second power transistor. The skilled person will understand that the class D audio amplifier may comprise a plurality of protection circuits connected to respective ones of the plurality of cascaded power transistors of the output stage to provide effective protection of the entire output stage. Each of the plurality of protection circuits may be largely identical to the first protection circuit albeit taking the polarity and voltage range of its associated power transistor into consideration as discussed in additional detail below with reference to the appended drawings.

The frequency of the first modulated gate drive signal or drive voltage, and of additional modulated gate drive signal(s) of additional power transistor(s) of the output stage, may lie between 100 kHz and 10 MHz, such as between 250 kHz and 2 MHz. The frequency of the first modulated gate drive signal will often correspond to a switching frequency of the class D audio amplifier. The switching frequency may depend on factors such as the selected type of modulation, e.g. pulse width modulation (PWM), pulse density modulation (PDM) or space vector modulation (SVM), and various performance metrics of the class D amplifier. Each power transistor of the output stage may therefore be switched between its conducting state and non-conducting state at the switching frequency of the audio amplifier.

The output stage of the class D audio amplifier may comprise an upper leg and a lower leg electrically interconnected at a midpoint node the midpoint node being connectable to a loudspeaker load. The upper and lower legs are forming a half-bridge driver. The lower leg may at least comprise the first power transistor and the upper leg at least comprises the second power transistor. In multilevel output stages, each of the upper and lower legs comprises two or more series connected, or stacked, power transistors as discussed in additional detail below with reference to the appended drawings. If the upper leg of the output stage comprises one or several N-type MOS transistors their respective gate drivers may have a power supply voltage connected to a separate high-side voltage supply which is generated by a voltage multiplier or charge pump. The voltage multiplier or charge pump may be configured to generate a high-side voltage which is between 2 V and 5 V higher than the upper or first DC supply voltage (Pvdd).

The skilled person will appreciate that the entire class D audio amplifier, or at least all active devices thereof, may be formed or integrated on a semiconductor substrate such as CMOS or DMOS integrated circuit. The semiconductor substrate provides a robust and low-cost single chip class D audio amplifier which is particularly well-suited for high-volume consumer oriented audio applications, such as TV sets, mobile phones and MP3 players, where cost is an essential parameter.

The first overload protection circuit may be configured to operate by an intermittent scheme which comprises repeatedly switching between a tracking phase for determining a current drain-source reference voltage and a holding phase for storage of the current drain-source reference voltage. The holding phase preferably lasts until a subsequent tracking phase is initialized. This feature allows considerable power consumption savings in first overload protection circuit for example if certain sub-circuits, such as a model-circuit with the model transistor and/or a voltage multiplier, are switched off, or powered-down, during the holding phase and merely in active states during the tracking phase where the current drain-source reference voltage is determined. The first overload protection circuit, in particular the previously discussed controller thereof, may be configured to select a first bias current level through the model-transistor during the tracking phase and select a second bias current level, smaller than the first bias current level, through the model-transistor during the holding phase. Despite the model-circuit may be unable to produce a valid representation or estimate of the current drain-source reference voltage in the holding phase, a valid representation of the drain-source reference voltage may be held on a suitable analog or digital storage element such as a holding capacitance or capacitor during the holding phase. Hence, the first overload protection circuit may comprise the holding capacitance and the latter being configured to be charged to the current drain-source reference voltage during the tracking phase and to maintain the current drain-source reference voltage during the subsequent holding phase as discussed in additional detail below with reference the appended drawings.

The reduction of power consumption of the first overload protection circuit is particularly pronounced when a duration of the holding phase is significantly longer than a duration of the tracking phase. The duration of the holding phase may be at least 5 times longer or even 10 times longer than a duration of the tracking phase such as at least 25 times longer than the tracking phase or even more preferably at least 50 times longer.

According to one embodiment, the first overload protection circuit is configured to transmit the overload signal to the gate driver of the first power transistor. The gate driver may comprise control logic responsive to the overload signal to selectively disconnect and interconnect gate and source terminals of the first power transistor based on a logic state of the overload signal. When the gate and source terminals of the first power transistor are interconnected, e.g. by a finite on-resistance of a transistor, the first power transistor is switched to its off-state and current through the power transistor interrupted. Hence, the first power transistor enters an overload protection state which may last for a certain period of time after triggering as discussed in additional detail below with reference the appended drawings.

The drain-source reference voltage may represent the drain-source voltage of the first power transistor at a predetermined target current through the first power transistor—for example a maximum allowable current through the first power transistor or any other suitable current that may act as trip point for activation of overload protection. The maximum allowable current may be determined by the device manufacturer to ensure the power transistor remains within its safe operating area to avoid permanent damage or performance degradation.

The first overload protection circuit may comprise a programmable or fixed current source for setting a bias current of the model/replica transistor where the bias current is placing the model transistor in triode-region operation.

The width to length (W/L) ratio of the model/replica transistor may be at least 100 times smaller than a width to length (W/L) ratio of the first power transistor such as at least 1000 times smaller than the width to length (W/L) ratio of the first power transistor. A large difference between the W/L ratios of the first power transistor and the model transistor enables a small current consumption of model-circuit while maintaining accurate tracking of the drain-source reference voltage and the drain-source voltage of the first output transistor as discussed in additional detail below with reference the appended drawings.

In one embodiment, the bias current of the model/replica transistor is set to a predetermined fraction of the predetermined target current of the first power transistor. This predetermined fraction is derived from a ratio between the W/L ratio of the model/replica transistor and the W/L ratio of the first power transistor. The W/L ratio of the model transistor may be smaller than 2 or 1 and the W/L ratio of the first power transistor may be larger than 1000 or larger than 5000.

The ratio between the respective W/L ratios of the model transistor and the first power transistor may be larger than 100 or larger than 1000 or even larger than 5000.

One embodiment of the first overload protection circuit is configured to estimate an overdrive voltage Vod of the first power transistor; and applying a predetermined fraction of the overdrive voltage, for example between one-third and one-fifth such as one-fourth of Vod to a gate terminal of the model/replica transistor for supplying a fractional drain-source reference voltage. The latter embodiment of the first overload protection circuit may additionally comprise a DC multiplication circuit, for example including a switched capacitor voltage multiplier, configured to multiply the fractional drain-source reference voltage by the reciprocal of the predetermined fraction to generate the drain-source reference voltage. The overdrive voltage Vod is an estimate of how much a control voltage, e.g. gate voltage, of the first power transistor exceeds its threshold voltage as discussed in additional detail below with reference the appended drawings.

The adaptation of the model transistor to merely generate a fractional drain-source reference voltage instead of the full drain-source reference voltage is advantageous because the bias current through the model transistor can be reduced as discussed in additional detail below with reference the appended drawings The first overload protection circuit may comprise a subtraction circuit configured to subtract the drain-source reference voltage and the drain-source voltage of the first power transistor to provide a difference voltage. A class B comparator is coupled to the difference voltage and configured for generating the overload signal based on the difference voltage. The class B comparator may comprise a first, and substantially unbiased state e.g. zero bias current, entered in response to a first polarity of the difference voltage and a second, and actively biased state, entered in response to a second polarity of the difference voltage. The first polarity of the difference voltage may thereby indicate a non-overload condition of the first output transistor while the second polarity of the difference voltage indicates the overload condition. This embodiment of the first overload circuit is advantageous due to its small power consumption enabled by placing the class B comparator in its unpowered state during normal operation of the output stage where the current through the first output transistor is smaller than the predetermined target current as discussed in additional detail below with reference the appended drawings.

The output stage may comprise an upper leg and a lower leg electrically interconnected at a midpoint node and the midpoint node being connectable to a loudspeaker load. Each of the lower and upper legs may comprise one, two or more series connected power transistors.

A second aspect relates to a method of protecting a power transistor of an output stage of a class D audio amplifier against overload current. The method comprises: applying an audio input signal to the class D audio amplifier; modulating the audio input signal to generate a modulated audio signal at a predetermined carrier or modulation frequency; deriving, from the modulated audio signal, a modulated gate drive signal for the power transistor of the output stage to repeatedly switch the power transistor between a conducting state and a non-conducting state; repeatedly determining a drain-source reference voltage of a model/replica transistor possessing electric characteristics representative of the power transistor; comparing the drain-source reference voltage with a drain-source voltage of the first power transistor; and generating an overload signal based on the comparison between the drain-source reference voltage and the drain-source voltage of the first power transistor.

The method may further comprise: transmitting the overload signal to a gate driver of the first power transistor; and selectively disconnecting and interconnecting gate and source terminals of the first power transistor via the gate driver based on a logic state of the overload signal.

Those skilled in the art will recognize additional features and advantages upon reading the following detailed description, and upon viewing the accompanying drawings.

BRIEF DESCRIPTION OF THE DRAWINGS

Embodiments are described in more detail in connection with the appended drawings, in which.

DETAILED DESCRIPTION

Figure 1:
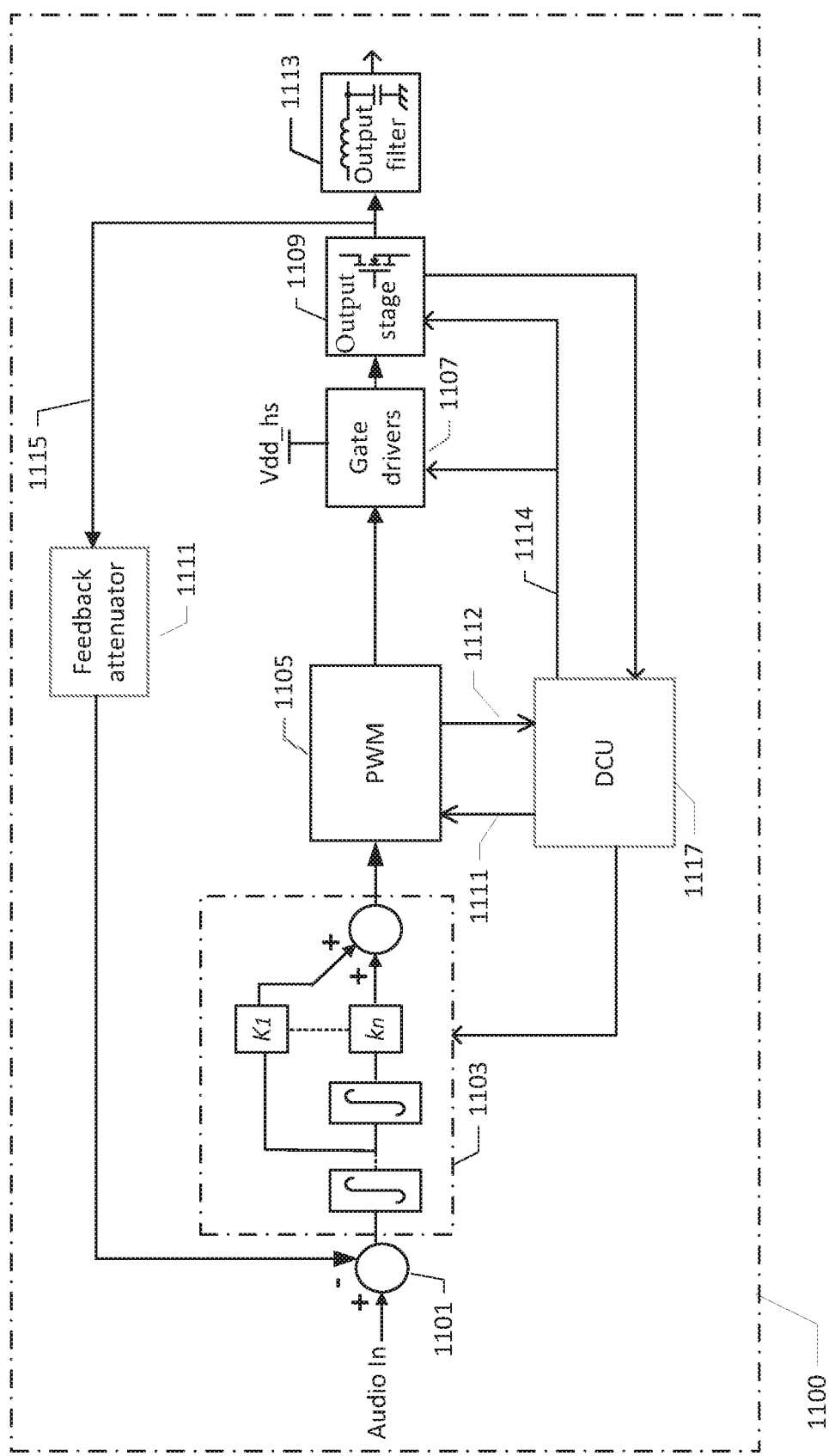
FIG. 1 illustrates schematically a class D audio amplifier with one or more overload protection circuits based on an exemplary embodiment.
Figure 2A:
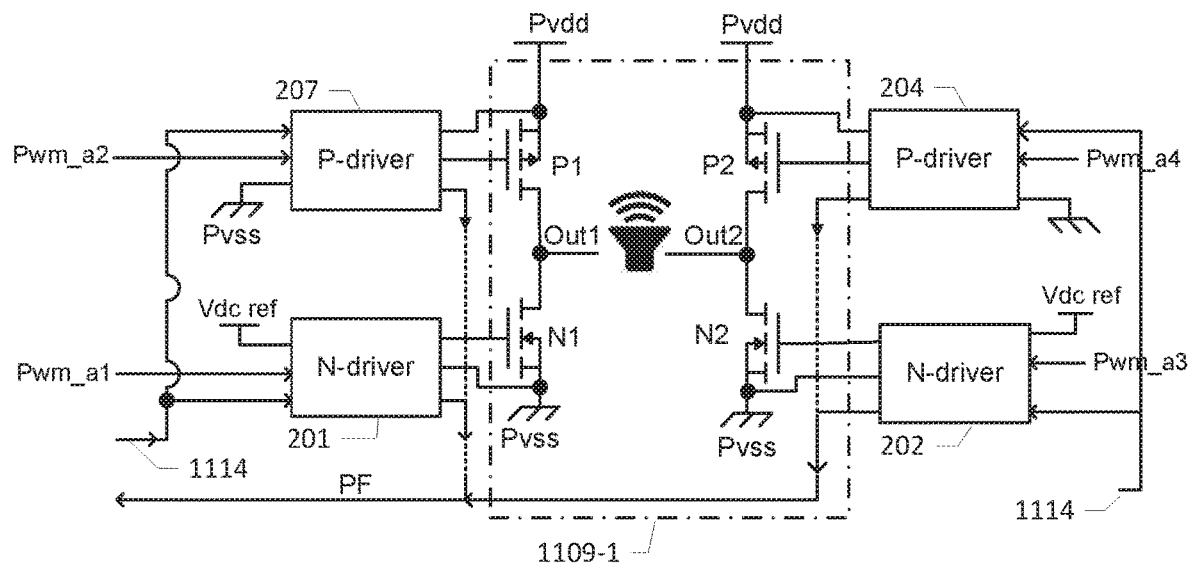
FIG. 2A illustrates an H-bridge output stage and associated gate drivers of a class D audio amplifier based on a first embodiment.
Figure 2B:
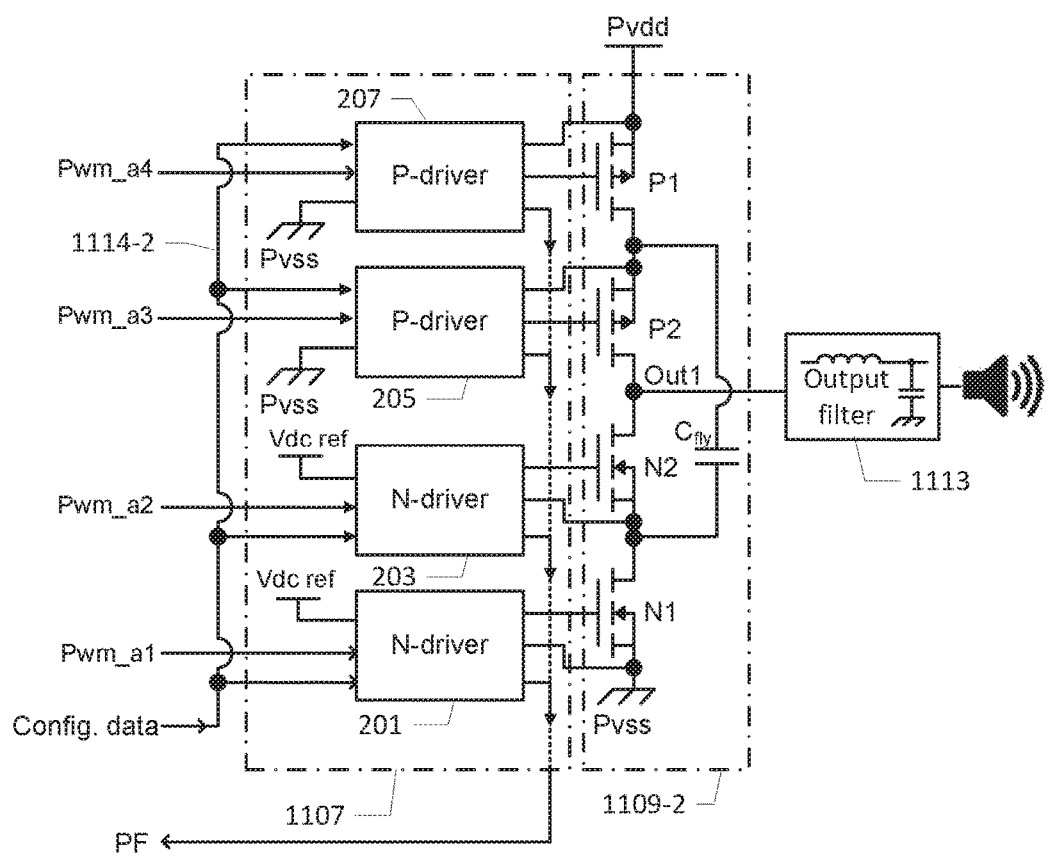
FIG. 2B illustrates a single ended multi-level output stage and associated gate drivers of a class D audio amplifier based on a second embodiment.

FIG. 1 schematically illustrates a PWM based class D audio amplifier 1100 comprising a single-ended or a balanced/differential H-bridge output stage, for example similar to a single ended multi-level output stage 1109-2 depicted on FIG. 2B or the H-bridge output stage 1109-1 depicted on FIG. 2A based on an exemplary embodiment. The present class D audio amplifier 1100 comprises one or several overload protection circuits associated with respective ones of a plurality of power transistors of the output stage. Each of the overload protection circuits may detect an actual drain-source voltage of the power transistor to be protected in its on-state and compare the actual drain-source voltage with a corresponding drain-source reference voltage to determine whether the instantaneous current through the power transistor exceeds a certain target/trip current which may represent a maximum allowable current through power transistor as discussed in additional detail below.

The class D audio amplifier 1100 comprises an input terminal or node for receipt of the audio input signal. The class D audio amplifier 1100 further comprises an analog summing node 1101 arranged in front of an adjustable loop filter 1103 for receipt of analog audio input signals at the Audio In node. A feedback signal 1115 is derived from the output voltage of the output stage 1109, prior to the optional output filter circuit 1113 and coupled to the summing node 1101 via a feedback attenuator 1111. The output voltage is subtracted from the analog audio input signal by the summing node 1101 to form an error signal or difference signal that is applied to an input of the fixed or adjustable loop filter 1103. The adjustable loop filter 1103 may possess numerous topologies and typically at least comprises one integrator or several cascaded integrators as schematically illustrated. The integrators are schematically illustrated in FIG. 1 by integrator symbols and respective gain coefficients, k1-kn, that are operative to lowpass filter the error signal before transmission to a modulator 1105. The modulator 1105 is configured for receipt of the lowpass filtered audio signal supplied at the output of the loop filter 1103 and converting this audio signal into a modulated audio signal at a predetermined carrier or modulation frequency. The modulator 1105 may for example comprise an analog or digital pulse width modulator (PWM) circuit or an analog or digital pulse density modulator circuit (PDM). The modulation or carrier frequency of the PWM modulator 1105 may be controlled by a clock circuit, e.g. arranged within the controller 1117, which generates synchronization pulses to the modulator 1105. The class D audio amplifier may include an adjustable PWM modulation frequency which may be switched between a number of pre-set values for example 150 kHz, 300 kHz and 600 kHz for high levels, medium levels and low levels, respectively, of the audio input signal. The maximum setting of the modulation frequency may lie between 300 kHz and 5 MHz in a number of useful embodiments.

The class D audio amplifier 1100 comprises a gate drive circuit or block 1107 which comprises a plurality of individual gate drivers having respective inputs coupled directly or indirectly to the modulated audio signal supplied by the modulator 1105. The modulator 1105 may be configured to derive multiple phases of the modulated audio signal and supply these phases to respective ones of the plurality of gate drivers to set a desired phase-relationship between the modulated gate drive signals of the plurality of power transistors. The modulated gate drive signals are applied to respective ones of a plurality of power or output transistors of the output stage 1109 such that each power transistor is repeatedly switched between a conducting state and a non-conducting state based on the modulated gate drive signal in question as discussed below. One or more of the gate drivers may comprise level shifter(s) in particular where the power transistor driven by the gate driver is arranged on a high-side of the output stage. The class D audio amplifier 1100 additionally comprises a control circuit 1117 which may control various operational parameters of the amplifier 1100. The control circuit 1117 may comprise a configuration data generator (not shown) connected via a configuration bus or wire 1114 to the gate driver circuit 1107 and, optionally, to the output stage 1109. The configuration data generator transmits specific configuration data to a configuration receiver (305 of FIG. 3) of the gate driver circuit 1107 to set various types of operational parameters of each of the plurality of gate drivers as discussed below. The configuration data generator is adapted to transmit specific configuration data to one or several overload or over-current protection circuit(s) (310 of FIG. 3) of the gate driver circuit 1107 to set various types of operational parameters of the overload protection circuit such as the previously-discussed target/trip current for the power transistor(s), latching time constants of an overload signal and optionally various parameters specific to manufacturing testing and/or adjustment. The control circuit 1117 may comprise a Digital Signal Processor (DSP) either in software programmable configuration or as dedicated computational hardware for example comprising a digital state machine, configured to provide the below described functions or operations based on a set of executable program instructions or hardwired states.

The control circuit 1117 may optionally be configured to determine the level of the audio signal and adjust the level of at least one of the modulated gate drive signals generated by at least one of the gate drivers based on the determined or detected level of the audio signal. This feature is schematically illustrated by the modulation monitoring signal 1112 running from the modulator 1105 to the controller 1117. In the alternative, the control circuit 1117 may for example determine the level of the audio signal by detecting the audio input signal at the input node, an internal node, or at the output of the power stage 1109 as further disclosed in the applicant's co-pending application EP 17170697.1 which is hereby incorporated by reference in its entirety.

FIG. 2A illustrates an H-bridge output stage 1109-1 and its associated gate drivers 201, 202, 203, 207 for respective ones of the power transistors N1, P1, N2, P2 of the H-bridge output stage 1109-1 of a class D audio based on a first embodiment. A first half-bridge driver comprises a lower leg with a NLDMOS or NMOS transistor N1 and an upper leg with a PLDMOS or PMOS transistor P1 electrically interconnected at a midpoint node Out1. The NLDMOS and PLDMOS transistors P1, N1 are connected in cascade between a first DC supply voltage (Pvdd) and a second DC supply voltage (Pvss). Pvdd may be a positive DC voltage between 5 V and 40 V while Pvss may be ground (GND) or a negative DC supply voltage. The midpoint node Out1 is connectable to a first terminal of a loudspeaker load as schematically illustrated. The H-bridge output stage 1109-1 additionally comprises a second half-bridge driver which comprises a lower leg with a NLDMOS or NMOS transistor N2 and an upper leg with a PLDMOS or PMOS transistor P2 electrically interconnected at a second midpoint node Out2. The midpoint node Out2 is connectable to a second terminal of the loudspeaker load as schematically illustrated. The skilled person will understand that the corresponding components of the first half-bridge driver and second half-bridge driver may be nominally identical in some embodiments. The corresponding modulated gate drive signals, or gate drive voltages, supplied by the respective gate drivers 201, 202, 203, 207 for the gates of the power transistors N1, P1, N2, P2 may be complementary such that the output voltages at nodes Out1 and Out2 are switched in opposite phase. The previously discussed configuration data for each of the gate drivers 201, 202, 203, 207 are supplied through the configuration bus or wire 1114. The configuration data of each gate driver comprises the previously discussed operational parameters of the overload protection circuit and may comprise other parameters for example programming the voltage level of the modulated gate drive signal supplied to the interconnected power transistors. The characteristics and application of these other parameters are disclosed in the applicant's co-pending application EP 17170697.1 which is incorporated by reference in its entirety. A first DC reference voltage (Vdc_ref) is powering each of the gate drivers 201, 202 for the NMOS transistors N1, N2 and this first DC reference voltage may be identical to the first DC supply voltage (Pvdd) or a lower DC voltage derived therefrom. The first DC reference voltage is preferably sufficiently high to provide a suitable level or voltage of the respective modulated gate drive signals applied on the gates of the NMOS power transistors N1, N2 when the audio signal exceeds a signal level threshold. A high value of the first DC reference voltage provides a small on-resistance of the NMOS power transistors N1, N2 when they are switched on, i.e. in their conducting state. On the other hand, the first DC reference voltage should not exceed any specified maximum safe gate-source voltage of the power transistors. The skilled person will appreciate that the first DC reference voltage (Vdc_ref) for example may lie between 3 V and 6 V depending on dimensions and semiconductor characteristics of the NMOS power transistors N1, N2. Similar considerations apply for the gate drivers 204, 207 and their associated PMOS transistors P1, P2.

Pulse width modulated audio signals Pwm_a1, Pwm_a2, Pwm_a3 and Pwm_a4 are applied to respective signal inputs of the gate drivers 201, 202, 203, 207. These pulse width modulated audio signals Pwm_a1, Pwm_a2, Pwm_a3 and Pwm_a4 may be buffered and, possibly level-shifted, by the respective gate drivers as needed to generate appropriately modulated gate drive signals for respective ones of the gate inputs/terminals of the power transistors N1, P1, N2, P2 to appropriately switch each of the power transistors between on-states and off-states based on the modulated gate drive signal in question.

FIG. 2B illustrates a single ended multi-level output stage 1109-2 and its associated gate drivers 201, 203, 205, 207 for respective ones of the power transistors N1, N2, P1, P2 of the output stage 1109-2 of a class D audio based on a second embodiment. The multi-level output stage 1109-2 comprises a lower leg comprising the first and second NLDMOS or NMOS transistors N1, N2 and an upper comprising the first and second PLDMOS or PMOS transistors P1, P2. The upper and lower legs are electrically interconnected at a midpoint node Out1. The NLDMOS and PLDMOS transistors N1, N2, P1, P2 of the output stage are connected in cascade between a first DC supply voltage (Pvdd) and a second DC supply voltage (Pvss). Pvdd may be a positive DC voltage between 5 V and 40 V while Pvss may be ground (GND) or a negative DC supply voltage. A flying capacitor is connected between first and second intermediate nodes of the output stage and may be charged to a voltage of about one-half of Pvdd minus Pvss. The midpoint node Out1 is connectable to a first terminal of a loudspeaker load, possibly through the optional lowpass filter 1113, as schematically illustrated. The skilled person will appreciate that alternative embodiments of the multi-level output stage may comprise an H-bridge topology similar to the one discussed above. The skilled person will also understand that the NLDMOS N2 and its gate driver 203 are arranged on a high-side portion of the output stage and appropriate level shifters may be needed for driving gate-source terminals of N2. The skilled person will understand that corresponding components of the lower leg and gate drive circuits may be nominally identical in some embodiments. The corresponding modulated gate drive signals supplied by the respective gate drivers 201, 203, 205, 207 for the gates of the power transistors N1, N2 and, P1, P2 may be relatively phase shifted such that the output voltage at node Out1 is switched between three discrete voltage levels: Pvdd, 0.5 Pvdd and Pvss assuming that the latter is GND in the present embodiment. As discussed above configuration data associated with the operation of the overload protection circuit of each of the gate drivers 201, 203, 205, 207 are supplied, or written, by the controller through the configuration bus or wire Config. data (1114-2). This data interface accordingly enables the previously discussed controller to adjust various operational parameters of the overload protection circuit, such as the target or trip-point current of protection circuit, as needed.

Figure 3:
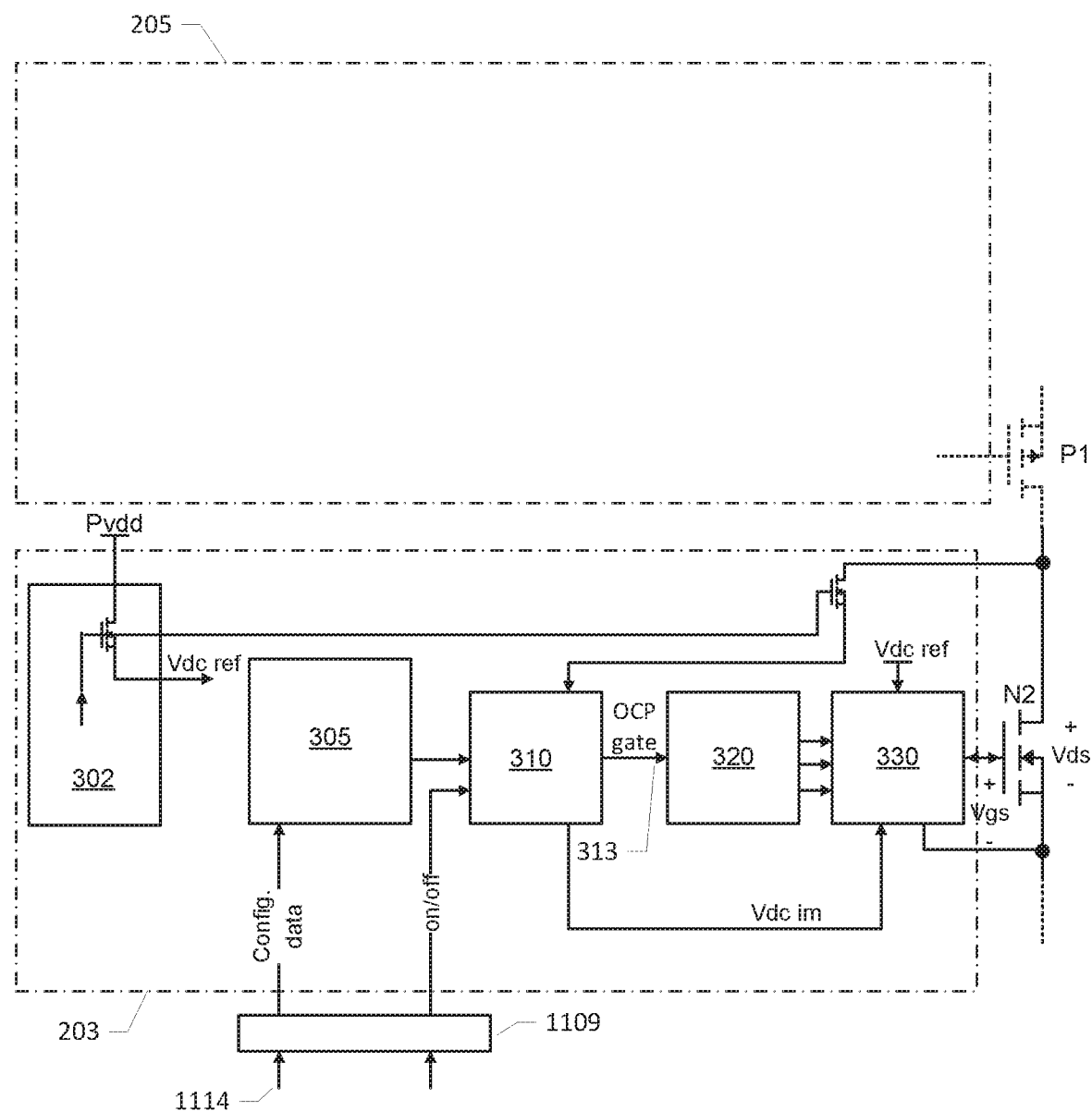
FIG. 3 is a simplified block diagram of an exemplary gate driver for application in a class D audio amplifier depicted on FIG. 1.

FIG. 3 is a simplified block diagram of an exemplary embodiment of the previously discussed gate driver 203 or driver circuit for the high-side LDNMOS transistor N2. The gate driver 203 comprises a linear regulator 302 configured to derive the previously discussed first DC reference voltage (Vdc_ref) from the first or positive DC supply voltage Pvdd. The linear regulator 302 may comprise an output voltage control loop establishing, via a suitable reference voltage or current, a fixed and stable level of the first DC reference voltage despite variations of the positive DC supply voltage Pvdd. The gate driver 203 comprises the previously discussed configuration receiver 305 coupled to the controller through a level translator circuit 1109 for reception of the configuration data through data bus 1114 for volatile or non-volatile storage of various type of configuration data of the gate driver 203. The configuration receiver 305 reads and stores the previously discussed operational parameters of the overload protection circuit and possibly other operational parameters of the gate driver such as a level mode bit or control signal selecting the level or voltage of the modulated gate drive signal supplied to the interconnected power transistor. The previously discussed over-current or overload protection circuit 310 is configured to monitor and limit current through the power transistor N2 to prevent overcurrent and/or overvoltage damage or destruction of N2. The overload protection circuit 310 interfaces to a drive resource circuit 320 via a signal wire or bus 313 which carries a latched version of the previously discussed overload signal to the drive resource circuit 320. The drive resource circuit 320 interfaces to the gate resource circuit 330 to control the operation of various hardware components therein as discussed in additional detail below.

Figure 4A:
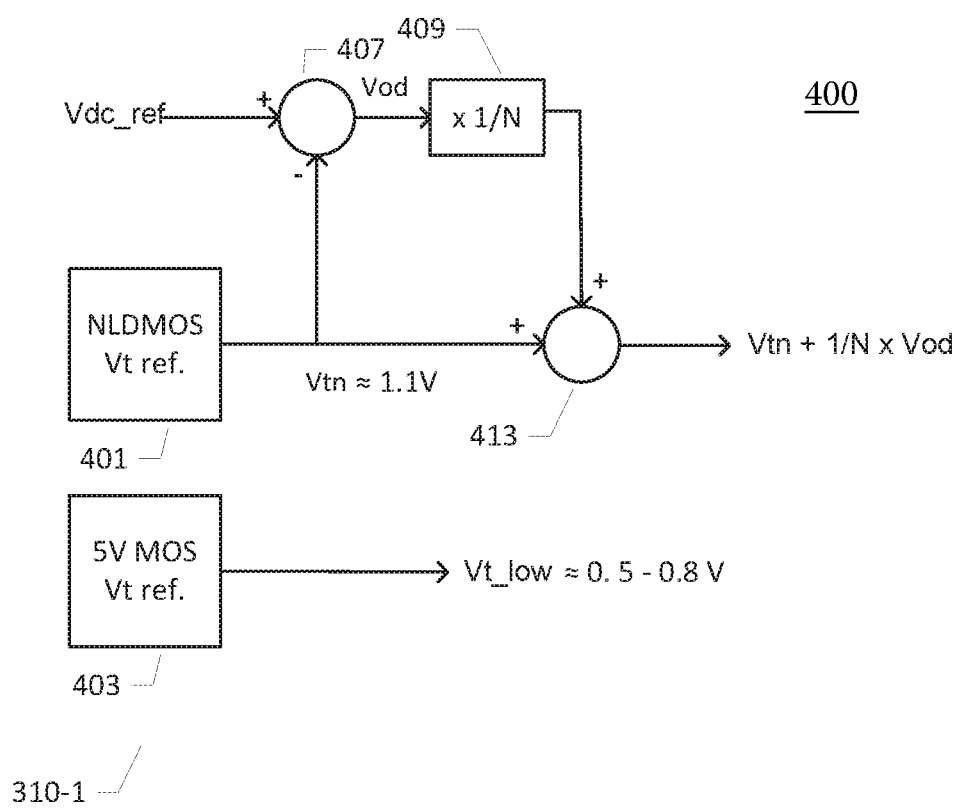
FIGS. 4A and 4B are block diagrams of an exemplary embodiment of the overload protection circuit.

FIG. 4A is a simplified block diagram of a first sub-circuit or portion 310-1 of the overload circuit 310 and comprises a first DC reference voltage generator 400. The first DC reference voltage generator 400 comprises first and second threshold detectors 401, 403. Each of the previously discussed gate drivers 201, 203, 205, 207 may include a dedicated overload circuit with such a DC reference voltage generator or a single DC reference voltage generator may be shared by several gate drivers depending on the topology of the output stage. The signals provided by the first DC reference voltage generator 400 may be shared with the previously discussed adaptive gate driver circuit discussed in the applicant's co-pending application EP 17170697.1 to obtain efficient hardware sharing between multiple functions such as the overload protection and adaptive gate driver of the gate driver circuits.

The first DC reference voltage Vdc_ref which is applied to the first DC reference voltage generator 400 may be generated externally or internally and applied to a first input of a first adder or summer 407 of the DC reference voltage generator 400. The DC reference voltage generator 400 is configured to derive a reference gate voltage Vtn+1/N*Vod for a model-transistor circuit (451 of FIG. 4B) to set an appropriate bias point of the previously discussed model-transistor of the model-transistor circuit (451 of FIG. 4B). The reference gate voltage is derived from a difference between the first DC reference voltage Vdc_ref and the estimated threshold voltage Vtn of the power transistor N2. The DC reference voltage generator 400 comprises a first threshold detector 401 which is configured to estimate a threshold voltage of the power transistor N2. N2 may be a MOS device, DMOS device or IGBT device of N type e.g. an NLDMOS device. The first threshold detector 401 comprises a model or test transistor of the same type as the power transistor N2 to ensure that electrical characteristics, in particular the threshold voltages, of the power transistor N2 and the test transistor are tracking over semiconductor process variations and operational temperature changes. The power transistor N2 and test transistor may for example be arranged in physical proximity on a common semiconductor substrate holding the gate driver to improve device tracking despite the dimensions of the power transistor N2 are significantly larger than those of the test transistor. The test transistor may be diode-coupled and a test generator (not shown) may be configured to intermittently, or continuously during operation of the class D amplifier, apply a pre-set test current to the test transistor e.g. flowing between the drain-source terminals or nodes of the test transistor. The test current may be between 1 µA and 100 µA—for example 2-3 µA to minimize power consumption. The threshold detector 401 finally outputs the determined threshold voltage Vtn of the test transistor as an estimate of the actual threshold voltage of the first power transistor N2. The estimated threshold voltage Vtn may lie between 0.9 V and 1.3 V such as about 1.1 V for an N-type MOS transistor as indicated on the drawing. The intermittent operation of the test current generator will lead to considerable power savings in the first threshold detector 401 if the active or operational time period is markedly shorter than the inactive time period during operation of the class D audio amplifier.

The DC reference voltage generator 400 additionally comprises a second threshold detector 403 which is configured to estimate a threshold voltage of a typical low-voltage MOS transistor of the gate driver. This typical low-voltage MOS transistor may be an ordinary or low-voltage NMOS device or an ordinary or low-voltage PMOS device. The threshold detector 403 preferably comprise a reference transistor of the same type as a transistor $M_1$ of a class-B comparator (459 on FIG. 4B) and both of these transistors may be typical low voltage transistors of the integrated circuit. The latter condition ensures that electrical characteristics, in particular threshold voltages, of the reference or model transistor and the transistor of the class-B comparator track over semiconductor process variations and operational temperature changes. The second threshold detector 403 may otherwise operate in a similar manner to the first threshold detector 401 discussed above to estimate the threshold voltage Vt_low of the typical low voltage transistor.

The DC reference voltage generator 400 comprises a first subtractor 407 which subtracts Vdc_ref and the estimated threshold voltage Vtn of the power transistor N2 to determine an overdrive voltage Vod. The overdrive voltage Vod is an estimate of how much the gate voltage of M2 exceeds its threshold voltage when the gate voltage equals the first DC reference voltage. A predetermined fraction, for example between one-third and one-fifth, i.e. N=3 and N=5 where N is a positive integer, of this overdrive voltage Vod is computed or determined by a division circuit 409 and the fractional overdrive voltage transmitted to a second summer of summing circuit 413. The division circuit 409 may for example comprise a switched capacitor divider. The summer 413 adds the predetermined fraction of Vod to the estimated threshold voltage Vtn to provide a threshold compensated overdrive voltage Vtn+1/N Vod at the output of the sum circuit 413. The threshold compensated overdrive voltage Vtn+1/N Vod is applied to the gate terminal of the model-transistor of the model-transistor circuit (451 of FIG. 4B) as discussed below. The skilled person will appreciate that the computation and use of the predetermined fraction of the overdrive voltage Vod by the division circuit 409 is merely an optional feature. Alternative embodiments of the DC reference voltage generator 400 may add the entire overdrive voltage Vod to the estimated threshold voltage Vtn and make appropriate compensation in the model-transistor circuit.

Figure 4B:
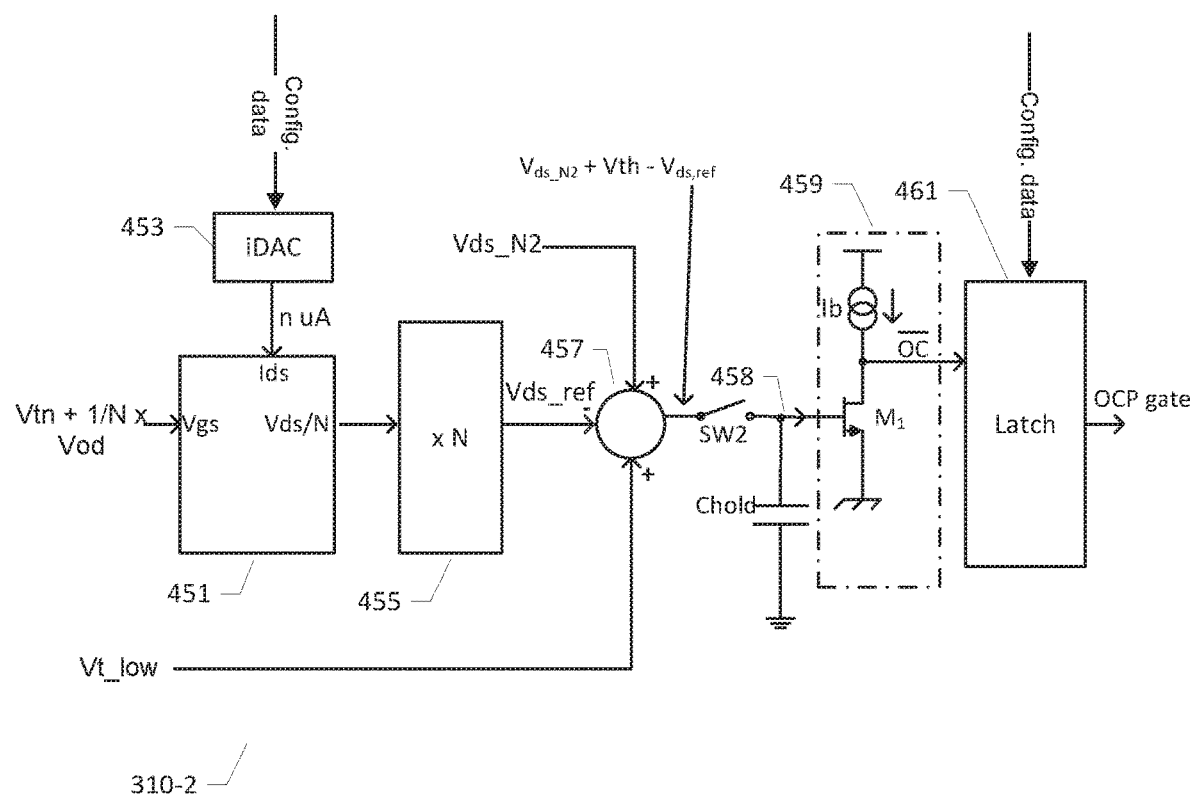

The threshold compensated overdrive voltage Vtn+1/N Vod and threshold voltage Vt_low are applied to respective inputs to a second portion 310-2 of the overload circuit 310 illustrated on FIG. 4B. The threshold compensated overdrive voltage is applied to the input of the model-circuit 451 to place the model-transistor 501(N2-Model) therein under appropriate triode operating conditions which accurately represent or model the drain-source resistance and drain-source voltage of the power transistor N2.

Figure 5:
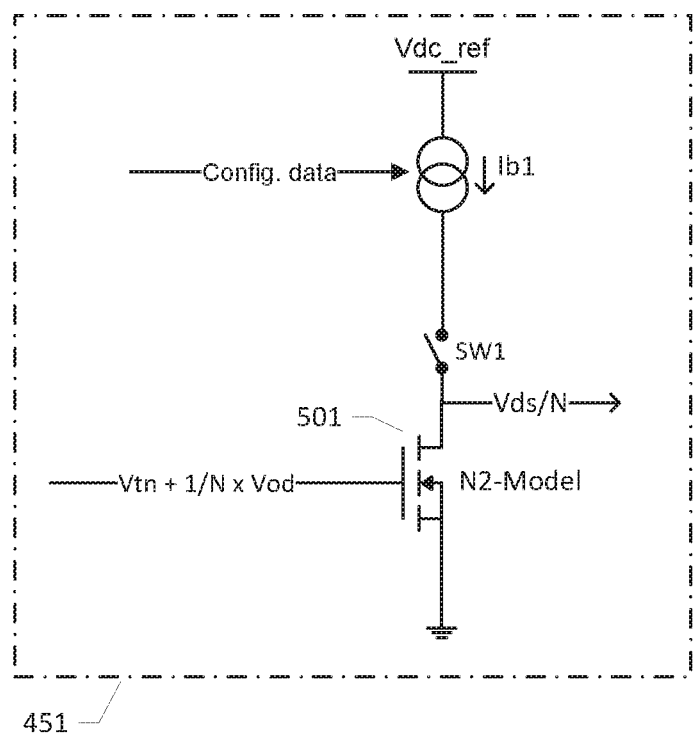
FIG. 5 shows a transistor level diagram of an exemplary model-transistor circuit of the overload protection circuit.

FIG. 5 shows a transistor level diagram of the model-circuit 451. The model-circuit 451 comprises a programmable or fixed current source Ib1 for setting a bias current of the model/replica transistor 501. The bias current is selected such that the model transistor resides in triode-region operation when the threshold compensated overdrive voltage is applied to the gate terminal of the model-transistor 501. The bias current delivered by the current source Ib1 may be fixed at manufacturing or programmable according to certain data bits or fields of the previously discussed configuration data as schematically illustrated. Hence, the model-transistor 501 exhibits a certain drain-source resistance which leads to the generation of a scaled drain-source reference voltage Vds/N where the scaling ratio or factor, N, corresponds to the integer N of the predetermined fraction of Vod. In other words, if the fractional overdrive voltage is 0.25*Vod then the scaled drain-source reference voltage Vds/N across the model-transistor 501 is also 0.25 times the drain-source reference voltage Vds. The model-transistor 501 is of the same type and polarity as the power transistor N2, e.g. an LDNMOS, such that the electric characteristics of the model-transistor 501, in particular its drain-source voltage, are representative of the electric characteristics of the first power transistor N2. However, the physical dimensions of the model-transistor 501 are markedly smaller than the dimensions of the first power transistor. The model-transistor 501 may for example possess a width to length (W/L) ratio which is at least 100 times smaller than a width to length (W/L) ratio of the first power transistor for example 1000 times or more smaller than the width to length (W/L) ratio of the first power transistor.

The bias current through the model-transistor 501 is preferably set to a predetermined fraction of a target current or trip-point current of the first power transistor where the latter current may be set to a maximum current of the first power transistor. The predetermined fraction of the target current of the first power transistor used for biasing the model-transistor 501 may conveniently be determined by, or derived from, the dimensions ratio of the model-transistor 501 and the first power transistor. Consequently, if the W/L ratio of the first power transistor N2 is 1000 and the target current of the first power transistor is 5 A and the W/L ratio of the model-transistor 501 is selected to 1 then the bias current of the model-transistor 501 may be set to 5 A/1000=5 mA. The 5 mA bias current leads to, if the gate source voltage of the model-transistor 501 is equal to Vdc_ref, a drain-source reference voltage across the model-transistor 501 which is substantially equal to the drain-source voltage across the first power transistor at the 5 A target current under triode-region operation and a gate voltage of Vdc_ref. The skilled person will appreciate that the reduced physical dimensions of the model-transistor 501 allow the generated drain-source reference voltage to accurately track or represent the drain-source voltage across the first power transistor at the target current, while keeping the power consumption of the model-circuit to a minimum e.g. the above-discussed 5 mA bias current. The low power consumption of the model-circuit 451 is advantageous because the overload protection circuit must remain continuously responsive during operation of the output stage of the class D amplifier including under quiescent operating conditions and at small output signal levels.

The overload circuit 310 includes another power consumption reducing feature derived from the previously-discussed, optional, use of the fractional portion of the overdrive voltage as drive/gate voltage of the model-transistor 501 rather than the full overdrive voltage Vod which corresponds to the gate drive voltage of the first power transistor. As briefly mentioned above, the fractional overdrive voltage on the model-transistor 501 leads to a corresponding fractional reduction of the drain-source voltage developed across the model-transistor. Hence, at N=4 the drain-source voltage developed across the model-transistor 501 is one-fourth of the true drain-source reference voltage Vds_ref and can be viewed as a fractional drain-source reference voltage Vds/N. The fractional property of the drain-source reference voltage is subsequently compensated by a suitable N times multiplication function or circuit to restore the desired drain-source reference voltage Vds_ref. The present embodiment of the overload circuit 310 uses a switched capacitor voltage multiplier 455 to carry out this N times multiplication function and deliver the true drain-source reference voltage Vds_ref to a first input of a summing circuit 457. The design or adaptation of the model-circuit 451 to merely generate a fractional drain-source reference voltage Vds/N instead of the full drain-source reference voltage is advantageous because the level of the bias current Ib1 can be reduced by the scaling factor N such that the power consumption of the model-transistor 501 is reduced by a factor N. An exemplary embodiment of the switched capacitor voltage multiplier 455 providing scaling factor N of four as illustrated on FIG. 6, but other embodiments may use scaling factors between 8 and 3.

Figure 6:
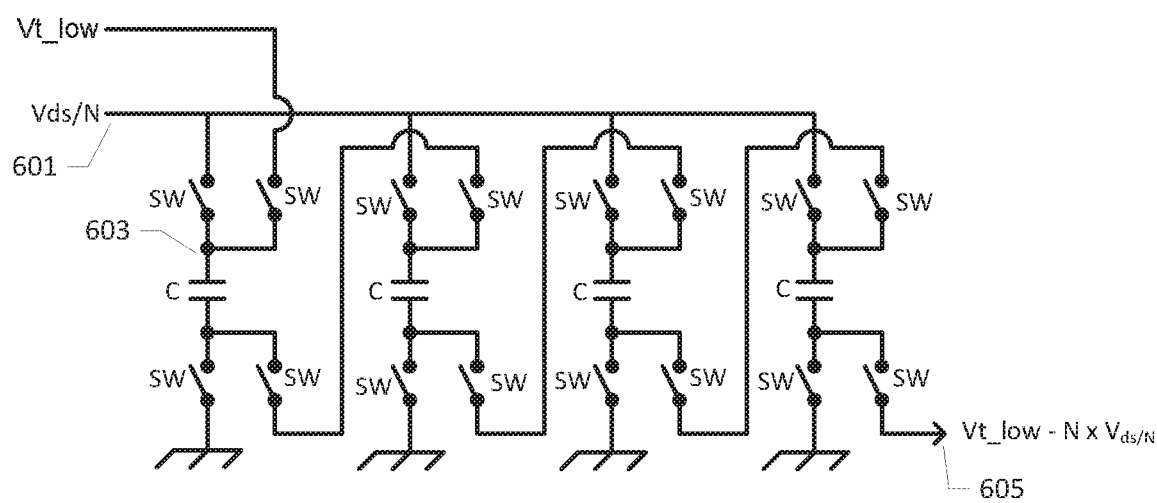
FIG. 6 shows a simplified schematic diagram of an exemplary switched-capacitor voltage multiplier of the overload protection circuit.

The switched capacitor voltage multiplier 455 illustrated on FIG. 6 comprises four cascaded stages each comprising a capacitor and four switches SW to gradually increase the input voltage at input terminal 601. The fractional drain-source reference voltage Vds/N is applied to the input terminal 601 and the true drain-source reference voltage Vds_ref, i.e. corresponding to N×Vds/N, is restored at the output node 605 of the voltage multiplier 455. The skilled person will appreciate that the stages of the switched capacitor voltage multiplier 455 can be reduced or increased to accommodate other integer values of the scaling factor N than four. The switched capacitor voltage multiplier 455 additionally carries out a subtraction operation as a special feature by the introduction of the previously-discussed threshold voltage Vt_low of the typical low voltage transistor onto the internal node 603. In this manner, the output voltage of the switched capacitor voltage multiplier 455 is equal to: Vt_low minus Vds_ref. In this manner the subtraction function implemented by the summing circuit 457, as schematically illustrated by the block diagram of FIG. 4B, is carried out in an integral and efficient manner by the switched capacitor voltage multiplier 455. The actual or measured drain-source voltage, Vds_N2, of the first power transistor N2 is finally inputted to the summing circuit 457 such that the output voltage of the summing circuit 457 equals:

Vds_N2−Vds_ref+Vt_low.

The skilled person will appreciate that the addition of the threshold voltage Vt_low to the summing circuit 457 is an optional feature which serves to compensate for the threshold voltage of the transistor $M_1$ of the class-B comparator (459). Hence, other embodiments of the overload protection circuit may use another type of comparator circuit without any DC off-set voltage and therefore eliminating the need to add the threshold voltage Vt_low to the summing circuit 457. The output voltage of the summing circuit 457 is applied to a holding capacitor Chold through a controllable switch SW2 for example comprising one or more MOS transistors. The output voltage of the summing circuit 457 charges the voltage across the holding capacitance Chold to the same voltage when SW2 is conducting during a tracking phase of the overload protection circuit. The holding capacitor Chold largely maintains the output voltage of the summing circuit 457 during a subsequent holding phase, where SW2 is switched to its off or non-conducting state. The ability to retain the output voltage of the summing circuit 457 is inter alia due to a very large input resistance at an input node 458 of the class B comparator coupled to the holding capacitor Chold.

At least the model-circuit 451 and switched capacitor voltage multiplier 455 of the first overload protection circuit 310 are preferably operated by an intermittent scheme comprising the above-mentioned tracking phase and holding phase. This feature allows further reduction of the power consumption of the protection circuit. The model-circuit 451 and switched capacitor voltage multiplier 455 are preferably configured to repeatedly switch between the tracking phase for determining a current drain-source reference voltage Vds_ref and the holding phase for storage of the current drain-source reference voltage until the subsequent tracking phase is initialized. The intermittent operation of the model-circuit 451 is illustrated on FIG. 5 and may be carried out by a controllable switch SW1, e.g. including one or several MOSFETs, arranged in series with the model-transistor 501 and bias current source Ib1. The controllable switch SW1 is switched between its off-state and on-state such that the previously-discussed bias current flows through the model-transistor 501 during the on-state of SW1 to place the circuit in the tracking phase or mode wherein the current fractional drain-source reference voltage Vds/N is generated. In contrast, the bias current through the model-transistor 501 may be essentially zero in the off-state of SW1, or at least much smaller than the bias current in the on-state of SW1, i.e. during the holding phase. Hence, the model-circuit 451 will typically not produce a valid representation of the fractional drain-source reference voltage Vds/N during the holding phase, but this is inconsequential because a valid representation of the current drain-source reference voltage Vds is held on the holding capacitor Chold during the holding phase. However, the average power consumption of the model-circuit 451 may be drastically reduced if the duration of the holding phase is much longer than the duration of the tracking phase as discussed below.

The switched capacitor multiplier 455 may be switched between an active state and an inactive state synchronously with the tracking phase and holding phase, respectively. This state switching may be carried out by selectively enabling and disabling gate control signals of internal switches of the switched capacitor multiplier 455. The controllable switch SW2 is preferably also operated synchronously with the tracking phase and holding phase such that SW2 is switched on/conducting during the tracking phase to allow the output voltage of the summing circuit 457 to appropriately charge the holding capacitor Chold to essentially the same voltage. SW2 is switched to off/non-conducing during the holding phase where a large off-state resistance of SW2 and the large input impedance of the class-B comparator 459 ensure minimal discharging of the voltage on Chold.

The duration of the holding phase may be at least 5 times or 10 times longer than the duration of the tracking phase such as at least 25 times longer or more preferably at least 50 times longer. In one exemplary embodiment, the duration of the tracking phase lies between 0.5 μs and 10 μs and the holding phase may be at least 5 times or 10 times longer than the selected duration of the tracking phase. The class B comparator 459 enters an essentially unbiased and unpowered state when Vds_N2 is smaller than the current Vds_ref, because the output voltage of the summing circuit 457 amounts to Vds_N2−Vds_ref+Vt_low where the latter voltage corresponds to the threshold voltage of the MOSFET M1 for the reasons discussed above in connection with threshold reference circuit 403. Hence, when Vds_N2 (the actual drain-source voltage of the first power transistor N2) is smaller than the current Vds_ref voltage, the gate-source voltage of MOSFET M1 is smaller than its threshold voltage which leaves M1 in its cut-off region. This unpowered state of the class B comparator 459 leaves the logic state of the outputted overload signal OC_bar logic high indicating no overload and hence corresponds to normal operation of the output stage where the current through the output transistor N2 is smaller than the overload or trip-current level. Consequently, the power consumption of the class B comparator 459 is very small during normal operation of the output stage. On the other hand, the gate-source voltage of MOSFET M1 is pushed above its threshold voltage if Vds_N2 (the actual drain-source voltage of the first power transistor N2) exceeds the current Vds_ref voltage pushing MOSFET M1 past the saturation region and into the triode region with a bias current determined by the bias source Ib. The bias current may lie between 0.1 μA and 10 μA and this switches the class B comparator 459 into a powered state where the logic state of the overload signal OC_bar transitions to logic low. The logic low state indicates an overload event of the output stage, i.e. the current through the output transistor N2 exceeds the overload or trip-current level.

The skilled person will appreciate that the noticeable features of the class B comparator 459 include continuous-time operation in conjunction with very small power consumption under no overload conditions. The continuous-time operation of the class-B comparator 459 is beneficial because the comparator can respond near instantly to asynchronous overload events in the output stage and thereby rapidly turn-off the overloaded power transistor.

The skilled person will appreciate that overall effect of this intermittent operation of the model-circuit 451 and multiplier 455, and optionally the class-B operation of the comparator, is a substantial reduction of their average power consumption while the logic state of the overload signal remains valid at all times during operation of the output stage.

The logic state of the overload signal OC_bar supplied by the class B comparator 459 is preferably latched or held by a latch 461. The latch 461 preferably comprises one or several time constant circuits and possibly hysteresis to improve reliability of the overload protection circuit. The latch 461 may be operative to ensure that the evaluation or detection of the logic state of the overload signal OC_bar, supplied at the output of the class-B comparator 459, is carried out after a certain time delay relative to the turn-on instant of the power transistor N2. This time delay may lie between 10 ns and 500 ns depending on the switching time period of the output stage. The switching time period of the output stage may lie between 10 μs and 0.2 μs corresponding to a switching frequency or modulation frequency between 100 kHz and 5 MHz. This time delay is an advantageous feature because of a finite turn-on time of the power transistor where the time delay is selected such that the detection of the state of the overload signal OC_bar is only carried out after the power transistor is actually switched-on or conducting. The latch 461 may additionally include a hysteresis function or circuit which retains a state of a gated output signal, OCP gate, of the latch 461 for a certain holding time after a detected overload current event, as signalled by a logic state switching of the overload signal OC_bar. The hysteresis function of the latch 461 may for example retain the logic state of the gated output signal OCP gate for at least one switching time period of the output stage independent of any state switching of the overload signal OC_bar supplied by the class B comparator 459. Hence, transition rates of the overload protection circuit in and out of an overload protection state, as indicated by the OCP gate signal, faster than the nominal switching frequency of the class D audio amplifier are avoided.

As earlier discussed in connection with FIG. 3, the gated overload signal OCP gate is coupled to the drive resource circuit 320 associated with the first gate driver of the first power transistor via a suitable wire, trace or bus. The drive resource circuit 320 or gate resource circuit 330 comprises appropriately configured control logic (not shown) responsive to the gated overload signal OCP gate signal to selectively disconnect and interconnect gate and source terminals of the first power transistor N2 based on the logic state of the gated overload signal OCP gate. Consequently, when the state of the gated overload signal OCP gate indicates an overcurrent event in N2, the control logic may be configured to override any other control or switching logic connected to the gate terminal of N2 and pull the gate-source voltage of N2 to approximately zero to turn-off N2 and interrupt the excessive flow of current through N2.

Finally, the skilled person will appreciate that all four, eight or even more gate drivers of the output stage of the class D audio amplifier, e.g. the exemplary output stage embodiments illustrated on FIGS. 2A) and 2B) may comprise respective overload circuits that are operated in a corresponding manner to selectively protect each of the power transistors of the output stage against over-current events—for example events caused by a short-circuit at the output node of the output stage or by a too small impedance of a loudspeaker load connected to the output node of the output stage etc.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A class D audio amplifier, comprising:
   an input node or terminal configured to receive an audio signal;
   a modulator configured to convert the audio signal into a modulated audio signal having a carrier or modulation frequency;
   an output stage comprising a plurality of power transistors coupled in cascade between a first DC supply voltage and a second DC supply voltage;
   a plurality of gate drivers comprising respective inputs coupled to the modulated audio signal and configured to generate respective modulated gate drive signals to the plurality of power transistors;
   a first overload protection circuit comprising a model transistor having electric characteristics representative of a first power transistor of the output stage,
   wherein the first overload protection circuit is configured to:
     repeatedly determine a drain-source reference voltage of the model transistor;
     compare the drain-source reference voltage of the model transistor with a drain-source voltage of the first power transistor;
     generate an overload signal based on the comparison between the drain-source reference voltage of the model transistor and the drain-source voltage of the first power transistor; and
     operate by an intermittent scheme comprising repeatedly switching between a tracking phase for determining a current drain-source reference voltage of the model transistor and a holding phase for storage of the current drain-source reference voltage of the model transistor until a subsequent tracking phase is initialized.

2. The class D audio amplifier of claim 1, wherein the first overload protection circuit is configured to select a first bias current level through the model transistor during the tracking phase, and select a second bias current level, smaller than the first bias current level, through the model transistor during the holding phase.

3. The class D audio amplifier of claim 2, wherein a duration of the holding phase is at least 10 times longer than a duration of the tracking phase.

4. The class D audio amplifier of claim 3, wherein the duration of the holding phase is at least 50 times longer than the duration of the tracking phase.

5. The class D audio amplifier of claim 1, wherein the first overload protection circuit is configured to transmit the overload signal to the gate driver of the first power transistor, and wherein the gate driver of the first power transistor comprises control logic responsive to the overload signal to selectively disconnect and interconnect gate and source terminals of the first power transistor based on a logic state of the overload signal.

6. The class D audio amplifier of claim 1, wherein the drain-source reference voltage of the model transistor represents the drain-source voltage of the first power transistor at a predetermined target current through the first power transistor.

7. The class D audio amplifier of claim 6, wherein the first overload protection circuit comprises a programmable or fixed current source configured to set a bias current of the model transistor, wherein the bias current is configured to place the model transistor in a triode-region operation, and wherein a width to length (W/L) ratio of the model transistor is at least 100 times smaller than a width to length (W/L) ratio of the first power transistor.

8. The class D audio amplifier of claim 7, wherein the bias current of the model transistor is set to a predetermined fraction of the predetermined target current of the first power transistor, and wherein the predetermined fraction is derived from a ratio between the W/L ratio of the model transistor and the W/L ratio of the first power transistor.

9. The class D audio amplifier of claim 1, wherein the first overload protection circuit is configured to estimate an overdrive voltage of the first power transistor, apply a predetermined fraction of the overdrive voltage to a gate terminal of the model transistor for supplying a fractional drain-source reference voltage, and wherein a DC multiplication circuit is configured to multiply the fractional drain-source reference voltage by the reciprocal of the predetermined fraction to generate the drain-source reference voltage of the model transistor.

10. The class D audio amplifier of claim 1, wherein the first overload protection circuit comprises a holding capacitance configured to be charged to the current drain-source reference voltage of the model transistor during the tracking phase and to maintain the current drain-source reference voltage of the model transistor during the subsequent holding phase.

11. The class D audio amplifier of claim 1, wherein the first overload protection circuit comprises:
    a subtraction circuit configured to subtract the drain-source reference voltage of the model transistor and the drain-source voltage of the first power transistor to provide a difference voltage; and
    a class B comparator coupled to the difference voltage and configured to generate the overload signal based on the difference voltage.

12. The class D audio amplifier of claim 11, wherein the class B comparator comprises a first substantially unbiased state entered in response to a first polarity of the difference voltage, and a second actively biased state entered in response to a second polarity of the difference voltage.

13. The class D audio amplifier of claim 1, wherein the plurality of power transistors at least comprises:
    a second power transistor having an opposite polarity of the first power transistor; and
    a second overload protection circuit configured to generate an overload signal for the second power transistor.

14. The class D audio amplifier of claim 1, wherein the output stage comprises an upper leg and a lower leg electrically interconnected at a midpoint node, the midpoint node being connectable to a loudspeaker load.

15. A method of protecting a first power transistor of an output stage of a class D audio amplifier against overload current, the method comprising:
    applying an audio input signal to the class D audio amplifier;
    modulating the audio input signal to generate a modulated audio signal at a predetermined carrier or modulation frequency;
    deriving, from the modulated audio signal, a modulated gate drive signal for the first power transistor of the output stage to repeatedly switch the first power transistor between a conducting state and a non-conducting state;
    repeatedly determining a drain-source reference voltage of a model transistor possessing electric characteristics representative of the first power transistor;

comparing the drain-source reference voltage of the model transistor with a drain-source voltage of the first power transistor;
generating an overload signal based on the comparison between the drain-source reference voltage of the model transistor and the drain-source voltage of the first power transistor; and
repeatedly switching between a tracking phase for determining a current drain-source reference voltage of the model transistor and a holding phase for storage of the current drain-source reference voltage of the model transistor until a subsequent tracking phase is initialized.

16. The method of claim 15, further comprising:
transmitting the overload signal to a gate driver of the first power transistor; and
selectively disconnecting and interconnecting gate and source terminals of the first power transistor via the gate driver based on a logic state of the overload signal.

17. The method of claim 15, further comprising:
subtracting the drain-source reference voltage of the model transistor and the drain-source voltage of the first power transistor via a subtraction circuit to provide a difference voltage; and
generating the overload signal via a class B comparator based on the difference voltage.

18. The method of claim 17, further comprising:
placing the class B comparator in a first substantially unbiased state in response to a first polarity of the difference voltage; and
placing the class B comparator in a second actively biased state in response to a second polarity of the difference voltage.

19. The method of claim 15, further comprising:
selecting a first bias current level through the model transistor during the tracking phase; and
selecting a second bias current level, smaller than the first bias current level, through the model transistor during the holding phase.

20. The method of claim 15, further comprising:
estimating an overdrive voltage of the first power transistor;
applying a predetermined fraction of the overdrive voltage to a gate terminal of the model transistor for supplying a fractional drain-source reference voltage; and
multiplying the fractional drain-source reference voltage by the reciprocal of the predetermined fraction to generate the drain-source reference voltage of the model transistor.

* * * * *